(12) United States Patent
Staiger

(10) Patent No.: US 6,950,312 B2
(45) Date of Patent: Sep. 27, 2005

(54) ELECTRONIC UNITS AND METHOD FOR PACKAGING AND ASSEMBLY OF SAID ELECTRONIC UNITS

(75) Inventor: Dieter E. Staiger, Weil im Schoenbuch (DE)

(73) Assignee: International Business Machines Corporation, Armonk, NY (US)

( * ) Notice: Subject to any disclaimer, the term of this patent is extended or adjusted under 35 U.S.C. 154(b) by 228 days.

(21) Appl. No.: 10/255,840

(22) Filed: Sep. 26, 2002

(65) Prior Publication Data

US 2003/0061696 A1 Apr. 3, 2003

(30) Foreign Application Priority Data

Oct. 2, 2001 (EP) .......................................... 01123614

(51) Int. Cl.⁷ ................................................ H05K 5/00
(52) U.S. Cl. ........................... 361/752; 29/864; 53/410; 53/429; 361/754
(58) Field of Search .................. 29/825, 827, 829–832, 29/846, 739–741; 361/816, 818, 749, 752, 790, 792, 796; 174/660, 686; 53/410, 429, 436, 439, 443, 448, 466, 462

(56) References Cited

U.S. PATENT DOCUMENTS

| | | | | |
|---|---|---|---|---|
| 4,567,543 A | * | 1/1986 | Miniet ........................ | 361/749 |
| 4,997,032 A | * | 3/1991 | Danielson et al. ............ | 165/46 |
| 5,224,023 A | * | 6/1993 | Smith et al. ................. | 361/784 |
| 5,448,511 A | * | 9/1995 | Paurus et al. ................ | 365/52 |
| 5,776,797 A | * | 7/1998 | Nicewarner et al. ......... | 438/107 |
| 6,121,676 A | * | 9/2000 | Solberg ....................... | 257/686 |
| 6,281,577 B1 | * | 8/2001 | Oppermann et al. ........ | 257/724 |

FOREIGN PATENT DOCUMENTS

| | | | | |
|---|---|---|---|---|
| DE | 215760 A | * | 11/1984 | ............ B65D/5/04 |
| JP | 10211967 A | * | 8/1998 | ......... B65D/81/113 |

OTHER PUBLICATIONS

Donald E. McFadden, Tape and Box Package For Large Components, Mar. 1990, Motorola Inc., vol. 10.*

* cited by examiner

Primary Examiner—Kamand Cuneo
Assistant Examiner—Thanh S. Phan
(74) Attorney, Agent, or Firm—Joscelyn G. Cockburn

(57) ABSTRACT

The present invention discloses method for packaging and assembly of electronic units comprising a multi-planar board system in which each single planar board provides electrical contacts and/or signal drive to its successive planar board via a flexible cable forming the only connection between successive planar boards. In its packaged position the planar boards are laid upon one another without affixing them with each other or affixing them with the housing of the electronic unit, wherein the packaging of the planar boards preferably forming a daisy chain. Positioning and adjusting of the planar boards to each other is mainly achieved by the cover element being wrapped around all surfaces of the planar boards during the packaging process, positioning and clamping of the packaging of the planar boards within the housing is mainly achieved by the self-adapting suspension during the assembly process of the electronic unit into the housing. The cover element separating and concurrently adjusting each planar boards to each other has isolating, stabilizing, heat draining, and flexible attributes. The electronic unit is preferably arranged in a screw-less, and scalable housing.

15 Claims, 4 Drawing Sheets

ELECTRONIC UNITS AND METHOD FOR PACKAGING AND ASSEMBLY OF SAID ELECTRONIC UNITS

BACKGROUND OF THE INVENTION

1) Field of the Invention

The present invention relates to a method for packaging and assembly of electronic units and more particularly to packaging and assembly of electronic units requiring mechanical robustness and being used in rugged environmental conditions such as e.g. demanded by electronic devices used in industrial machinery and automotive control units.

2) Prior Art

Electronic units as addressed by the present invention are preferably small scalable electronic devices or embedded electronic devices, e.g. handheld devices, set-top systems, internet appliances, mainly used in rugged environmental conditions such as e.g. demanded by electronic devices used in industrial machinery tools and automotive electronic units. They normally comprising at least a processor, a storage media (ROM, RAM), and interfaces, e.g. interfaces to user and/or components to be controlled. The electronic unit itself is mostly arranged in a housing. The electronic components being part of the electronic units may be arranged in the housing either in a card-on-board system or a card stack system.

Typically card-on-board systems utilize a base planar-board (mother board) featuring extension slots and connectors allowing to customize/scale the system by adding on various system feature cards. The minimum base system is providing the overhead on power-source signal drive capability and electrical connectors supporting to assemble system configuration. As a result, it is necessary that the electronic components positioning within the housing of the electronic units be maintained. In addition, many card-on-board systems are developed to satisfy the requirements of a particular electronic assembly. Therefore, as the system size and configuration changes, an additional package is required which would also require changes on the motherboard. As a result, packaging for electronic units is relatively expensive.

Card stack systems provide a multi-planar-board system. The basic system functions as well as the potential system expansions are sub-divided and implemented into individual single planar boards. The single boards are rigidly stacked in a housing and separated by spacers. Electrical contacts and the signal drive between the single planar boards are achieved via specifically designed connectors. Finally, the multi-planar board system is separated from the housing of the electronic unit by a shock absorbing arrangement. The prior art card stack system does provide scalable electronic units. But by requiring precisely arranging the single boards in a rigid stacked arrangement in the housing, by providing the exact interconnections between the boards, and by providing shock-absorbing components the prior art stack system requires an expensive and time-consuming manufacturing and assembly process. As a consequence, overall cost of such prior art systems tends to be high.

U.S. Pat. Nos. 3,904,934 and 3,529,213 disclose examples of those prior art card stack systems.

In view of the above there is a need for a card stack system that corrects the problems of the prior art card stack systems.

SUMMARY OF THE INVENTION

It is, therefore, object of the present invention to provide a method to package and assemble electronic units having a multi-planar-board system without the disadvantages of prior art systems.

It is another object of the present invention to provide a scalable housing for those electronic units.

These objects have been solved by the features of the independent claims. Further advantageous embodiments of the present invention are laid down in the dependent claims.

The present invention discloses method for packaging and assembly of electronic units comprising a multi-planar board system in which each single planar board provides electrical contacts and/or signal drive to its successive planar board via a flexible cable forming the only connection between successive planar boards. In its packaged position the planar boards are laid upon one another without affixing them with each other or affixing them with the housing of the electronic unit, wherein the packaging of the planar boards preferably forming a daisy chain. Positioning and adjusting of the planar boards to each other is mainly achieved by the cover element being wrapped around all surfaces of the planar boards during the packaging process, positioning and clamping of the packaging of the planar boards within the housing is mainly achieved by the self-adapting suspension during the assembly process of the electronic unit into the housing. The cover element separating and concurrently adjusting each planar boards to each other has isolating, stabilizing, heat draining, electromagnetic shielding and flexible attributes. The electronic unit is preferably arranged in a screw-less, and scalable housing.

BRIEF DESCRIPTION OF THE DRAWINGS

Other objects, features and advantages will occur from the following description of the preferred embodiments and the accompanying drawings wherein.

DESCRIPTION OF THE ILLUSTRATED EMBODIMENT

Figure 1:
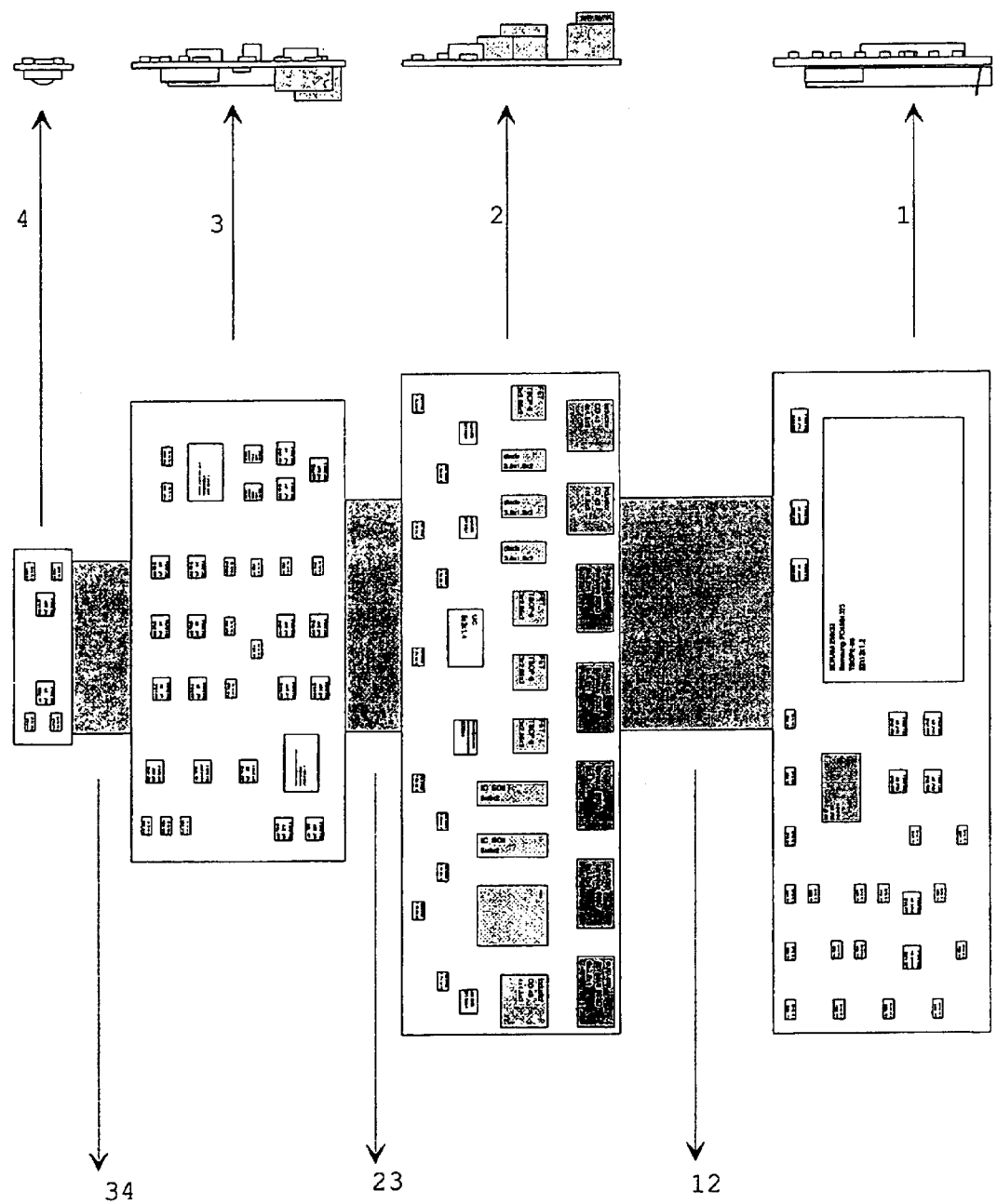
FIG. 1 shows the inventive flexible interconnections between the single planar boards of the multi-planar boards system of the electronic unit according to the present invention.

FIG. 1 shows a multi-planar board system with four boards 1–4 in a non-packaged position. The basic system functions as well as the potential system expansions are subdivided into four single planar boards 1–4. Each single extendible planar board 1 to 3 is at least providing the electrical contacts and signal drive supporting to extend the multi-planar system with a successive planar board. That means the drive capability as well as the signal distribution connectors are built up consequently when adding on a consecutive planar board. Each single extendible planar board 1–3 comprises a system specific entry connector on one side and a pass-on connector on another side. Another likely configuration is to have entry and pass-on connectors on one side of each planar board. Interconnections 12, 23, 34 between the single planar boards 1–4 are flexible cables. Advantageous the flexible cable can be built by a planar inner plane stub allowing to be connected to the next extender card at the end. Depending on the specific system to be implemented the connectivity can be provided utilizing small connector clamps or flexible cable may be simply soldered at the planars. The use of flexible cables (12, 23, 34) allows the entire arrangement of the single boards to be folded in a zigzag configuration, somewhat analogous to a concertina.

Figure 2:
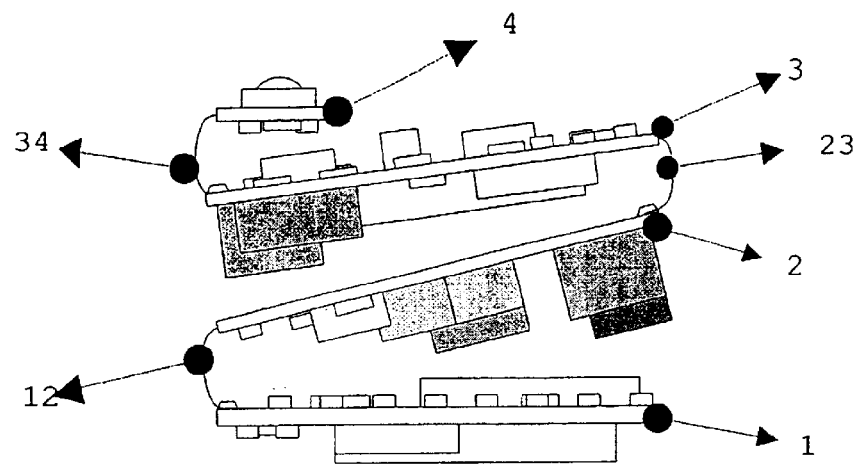
FIG. 2 shows a preferred embodiment of the arrangement of planar boards in a packaged position according to the present invention.

FIG. 2 shows a preferred embodiment of the arrangement of planar boards in a packaged position (cover element is not shown). The single planar boards 1–4 are arranged to each other in a so called "daisy chain". That means the single planar boards 1–4 are laid upon another without affixing them with each other or affixing them with the housing being used by the present invention. Positioning of the planar boards to each other is mainly achieved by the cover element being wrapped around all surfaces of the planar boards during the packaging process, positioning and clamping of the package of the planar boards within the housing is mainly achieved by the self-adapting suspension being part of the housing (not shown) during the assembly process. The only connections between the planar boards are the flexible cables (12,23,34). The use of flexible cables (12,23,34) allows the entire packaging of the planar boards to be folded in a zigzag manor concertina. In another embodiment of the present invention the flexible cables maybe arranged at the same sides of the planar boards connecting one planar board with another one. Preferably the electronic components of the opposite planar boards should be selected and arranged to each other to minimize the over-all height of the arrangement.

Figure 3:
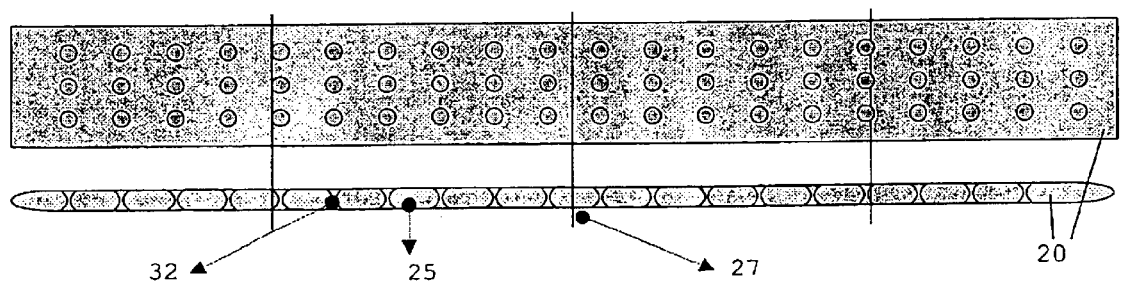
FIG. 3 shows a preferred embodiment of the cover element used by the present invention.
Figure 4:
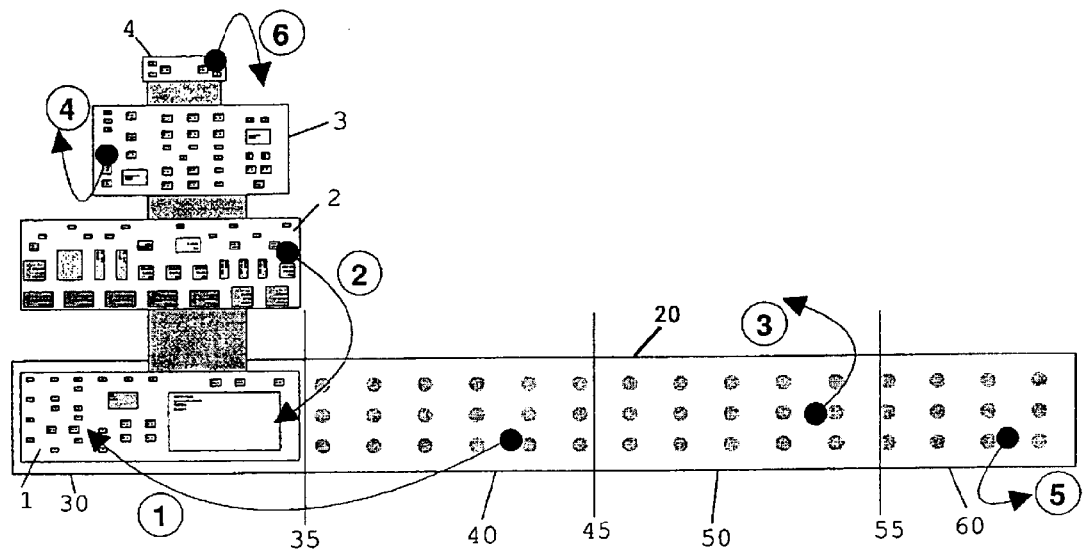
FIG. 4 shows the preferred method for packaging of electronic units according to the present invention.

FIG. 3 shows a specific embodiment of the inventive cover element 20 separating the planar boards from each other. In this embodiment the cover element is a heat pillow 20. The heat pillow 20 may be implemented as flexible plastic bag featuring stabilizing elements 32 and folding points 27. The plastic bag may be filled with heat conducting liquid 25. Depending on the electronics system requirements, if necessary, the plastic bag may in addition incorporate an electromagnetic shielding foil or may be filled with liquid featuring shielding attributes. The thickness may be defined taking the size and shape of the planar boards and utilized electronic components into account. The heat conducting liquid could be simply water and if required complemented by antifreeze add-ons. However, if advanced heat conducting characteristics and mechanical stabilization qualities are required, the bag may be filled applying specific liquids featuring lower flowing attributes. An alternative to heat conducting liquids 25 is a gel especially a silicon gel. The silicon gel is assembled mixing two base substances allowing the gel to be adjusted to the desired attributes. Furthermore, any other material with or without heat conducting liquids maybe used when that type of material fulfills following requirements;

1) the material must support mounting and positioning of the planar boards to each other
2) isolating the electrical parts and planar boards from each other
3) minimizing acceleration forces effecting bigger/higher mass electrical components
4) stabilizing the entire assembly keeping shock and vibration stress at a minimum
5) draining the dissipated heat energy from the electronic components
6) electromagnetic shielding of planar boards FIG. 4 shows the preferred method for packaging of electronic units by using the heat pillow of FIG. 3.

A first planar board 1 is placed onto a first part 30 of a cover element 20. In the first step the second part 40 of the cover element 20 is folded at its folding point 35 and placed at the surface of first planar board 1. In the second step the second planar board 2 is placed upon the first planar board 1 separated by the second part 40 of the cover element 20. In the third step the third part 50 of cover element 20 is folded at its next folding point 45 and placed at the second planar board 2. In the fourth step the third planar board 3 is placed at the second planar board 2 separated by the third part 50 of the cover element 20. In fifth step the fourth part 60 of the cover element 20 is folded at its folding point 55 and placed at the surface of the third planar board 3. In a sixth step the fourth planar board 4 is placed at the third planar board 3 separated by the fourth part 60 of the cover element 20. In a preferred embodiment of the present invention the longitudinal axis of said cover element (20) in its non-folded position and the longitudinal axis of multi-planar board in its non-packaged position are 90 rotated against each other when starting packaging of said planar boards.

All these steps may be easily accomplished by an automatic assembly processes since no screws or other fixing elements are required in order to assemble the planar boards with each other. Therefore, the manufacturing process as well as the assembly process can be simplified as much as possible by applying the present invention.

Figure 5:
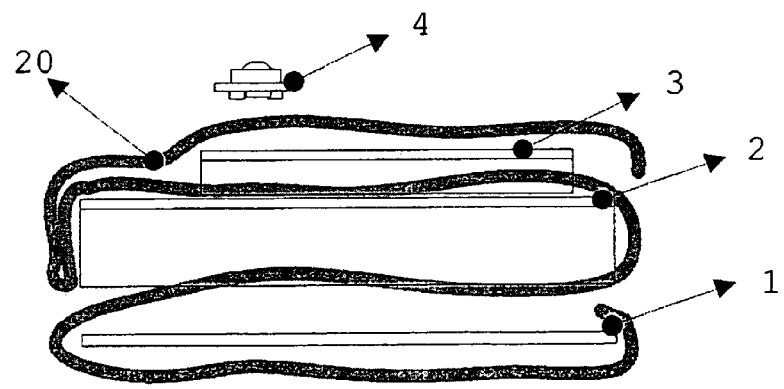
FIG. 5 shows the final package of the electronic unit.

FIG. 5 shows the final packaging of the electronic unit. The cover element 20 is folded around all contacts and surfaces of the planar boards 1–4 including their electronic components as described to FIG. 4. An essential advantage of that packaging is that the planar boards do not need to lined up in a rectangular/straight orientation—rather given by the size and height of the electronic components. The planar boards will be self-aligning to the best positioning angle thus utilizing the minimum amount of assembly space.

Figure 6:
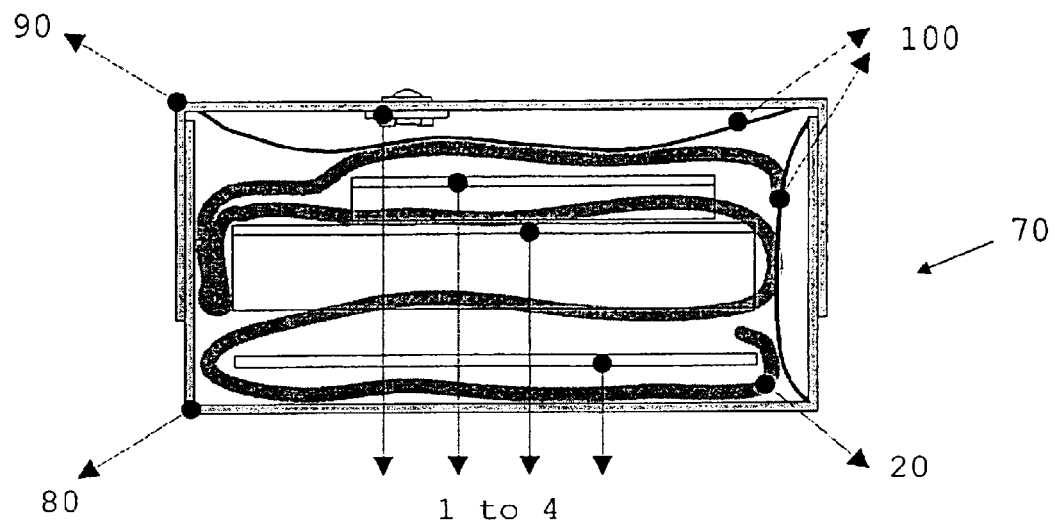
FIG. 6 shows the package of FIG. 5 arranged in a preferred embodiment of a housing.

FIG. 6 shows the housing 70 for the final packaging of FIG. 5. In its basic implementation the housing comprises a bottom shell 80 and a top shell 90. Furthermore, a self-adapting suspension 100 is preferably arranged at the inner side wall of the bottom shell 80 as well as at the inner side of the top shell 90. Other suspensions or springs achieving the same effect may be used also. When placing the packaging 1–4 of the electronic unit into the housing 70 the self-adapting suspensions 100 will automatically force the packaging in the right clamping position within the housing 70 and concurrently adjust the planar boards 1–4 with the right pressure against each other without using screws, spacers or other fixing elements. If required connectors to allow electrical signals to enter and exit the package can be fabricated in the housing.

Figure 7:
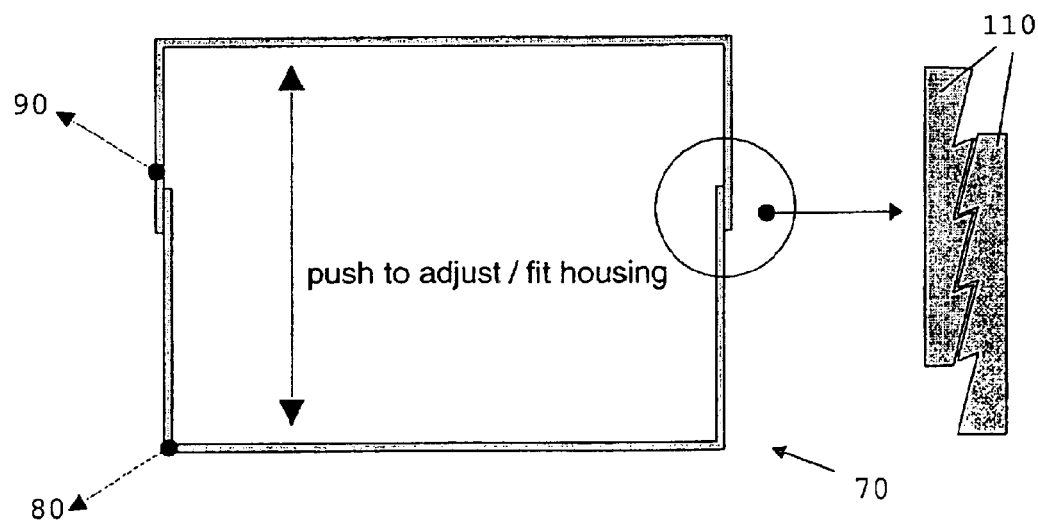
FIG. 7 shows the housing of FIG. 6 with its inter-locking structure.

FIG. 7 shows a preferred embodiment of the housing 70 as shown in FIG. 6. The scalable housing 70 comprising a bottom shell 80 and a top shell 90. The outer part of the bottom shell as well as the inner part of the top shell comprise a zigzag-teeth structure 110 allowing self-interlocking of top shell 90 with the bottom shell 80. When the top shell 90 is locked in the self-adapting suspension has reached a clamping force allowing adjusting the electronic unit in the housing. The zigzag teeth-structure 110 allowing to adjust the size housing dimension to fit the customized multi-boards system without replacing the bottom shell 80 or top shell 90. The zigzag-teeth structure 110 is one preferred embodiment of the present invention. Other embodiments having the same technical effects may be used also.

Summarizing, the present invention includes, among other things, the following components:

a scalable housing allowing to adjust the size of the housing to different sizes of electronic units, a mounting, adjusting, and cooling cover element used to physically align and stabilize the planar boards and concurrently used to transport the dissipated energy to the system housing components, a suspension arranged in the bottom and top shell of the housing to position and stabilize the package of the planar boards in the housing.

The main advantages of the present inventions are:

robust system attributes allowing shock resistant and vibration resistant system implementations, high system reliability due to robust packaging method. Heavier components placed on planar boards do not require specific mounting reinforcement, advantageous thermal behavior and minimized cooling effort, significant cost advantage due to:

reduced system assembly components ("screw-less" system mount) basic system cooling provided by packaging method fast system assembly (manufacturing) time, scalable system provided at a minimum base system scale-infrastructure hardware overhead and a minimum overhead on physical size and mass—easy system upgradability ("screw-less" system mount and flexible housing), reduced physical measures (size and weight), ease of maintenance and repair efforts.

The invention may be preferably used for handheld devices (e.g. mobile phones), set-top systems, internet appliances, PCs as well as to embedded electronic devices requiring mechanical robustness and being used in rugged environmental conditions such as e.g. demanded by electronic devices used in industrial machinery tools and automotive electronic units.

What is claimed is:

1. A method to package electrical units comprising:
providing a plurality of planar electronic circuit boards;
providing a cover element with defined folding points therein wherein said cover element being electrically non-conductive and free of electrical components;
connecting the plurality of planar electronic circuit boards with an electrical conductive member over which electrical signals between boards are being transmitted;
placing a first planar electronic circuit board with its bottom side at a first part of said cover element;
folding said cover element at a defined folding point and placing a first remaining part of said cover element upon the surface of the top side of said first planar board thereby covering the side surface of the first planar board;
placing a second planar board with its bottom side seated on said surface of the first remaining part of said cover element; and
folding another remaining part of said cover element at a further defined point and placing the remaining part of said cover element upon the surface of the top side of said second planar board thereby covering the side surface of said second planar board.

2. The method according to claim 1, wherein each of said planar electronic circuit boards includes a system specific entry connector at one side and a pass-on connector at the other side.

3. Packaging according to claim 2, wherein final packaging of said planar electronic circuit boards form a "daisy chain" configuration.

4. Packaging according to claim 1, wherein each of said planar electronic circuit boards includes a system specific entry connector and a pass-on connector at one side.

5. Packaging according to claim 1, wherein said cover element (20) is a plastic bag having stabilizing elements arid folding points, wherein said plastic bag is filled with a heat conducting liquid.

6. Packaging according to claim 1, wherein said cover element (20) is a plastic bag having stabilizing elements arid folding points, wherein said plastic bag filled with a liquid providing electromagnetic shielding attributes.

7. Packaging according to claim 1, wherein said cover element (20) is filled with a silicon gel.

8. Packaging according to claim 1, wherein said cover element (20) forms a continuous element.

9. Packaging according to claim 1, wherein the longitudinal axis of said cover element (20) in its non-folded position and the longitudinal axis of multi-planar board in its non-packaged position are 90° rotated against each other when starting packaging of said planar boards.

10. Packaging according to claim 1 wherein said cover element is filled with shielding foil.

11. The method of claim 1 wherein the electrical conductive member includes flexible cables.

12. The method of claim 1 further including for additional circuit boards repeating the placing and folding for each one until at least one side surface of a last one of the additional circuit boards is covered with said cover element.

13. A method to package electrical units comprising:
providing a loosely connected multi-planar electronic circuit board system including a plurality of single planar electronic circuit boards connected to one another by flexible electrically conductive cables and separated from one another by a continuous cover element wherein said continuous cover element is electrically non-conductive;
providing a housing having a lower shell section and an upper shell section;
fitting said system of said planar boards into said bottom shell (80) of said housing;
positioning and clamping of said system in said bottom shell (80) by a self-adapting suspension (100) being part of the bottom shell (80);
closing said housing with said top shell (90);
positioning and clamping of said packaging against said top shell (90) by a self-adapting suspension (100) being part of the top shell when said top shell is self-interlocking with said bottom shell (80).

14. Method according to claim 13, wherein said self-interlocking between top (90) and bottom (80) shell is accomplished by a zigzag-teeth structure (110) being part of contacting surfaces of said bottom and top shell.

15. A method to package electrical units comprising:
providing a plurality of planar electronic circuit boards;
providing a non-electrical conductive cover element;
connecting the plurality of planar electronic circuit boards with an electrical conductive member;
placing a first planar electronic circuit board with its bottom side at a first part of said cover element;
folding said cover element and placing a remaining part of said cover element upon the surface of the top side of said first planar board thereby covering the side surface of the first planar board;
placing a second planar board with its bottom side at said surface of the remaining part of said cover element;
folding said remaining cover element and placing the newly remaining cover element upon the surface of the top side of said second planar board thereby covering the side surface of said second planar board; and
repeating the placing and folding until at least a side surface of a last planar electronic circuit board is covered by said cover element.

* * * * *